United States Patent
Luan

(10) Patent No.: US 11,075,525 B2
(45) Date of Patent: Jul. 27, 2021

(54) METHOD AND DEVICE FOR MONITORING CHARGE AND DISCHARGE CURRENTS OF A BATTERY

(71) Applicant: Contemporary Amperex Technology Co., Limited, Fujian (CN)

(72) Inventor: Xiaofang Luan, Fujian (CN)

(73) Assignee: Contemporary Amperex Technology Co., Limited, Ningde (CN)

( * ) Notice: Subject to any disclaimer, the term of this patent is extended or adjusted under 35 U.S.C. 154(b) by 644 days.

(21) Appl. No.: 15/948,010

(22) Filed: Apr. 9, 2018

(65) Prior Publication Data

US 2018/0294658 A1    Oct. 11, 2018

(30) Foreign Application Priority Data

Apr. 7, 2017   (CN) .......................... 201710224196.6

(51) Int. Cl.
  *H02J 7/00*   (2006.01)
  *H02J 7/14*   (2006.01)
  *G01R 31/392* (2019.01)

(52) U.S. Cl.
  CPC .......... *H02J 7/0021* (2013.01); *G01R 31/392* (2019.01); *H02J 7/0029* (2013.01); *H02J 7/00304* (2020.01)

(58) Field of Classification Search
  USPC ........................................................ 320/134
  See application file for complete search history.

(56) References Cited

U.S. PATENT DOCUMENTS

| | | | | |
|---|---|---|---|---|
| 8,675,321 B2* | 3/2014 | Fortner | .............. | G01R 19/1659 361/31 |
| 2008/0252304 A1* | 10/2008 | Woo | ..................... | A61B 5/0536 324/692 |
| 2009/0163781 A1* | 6/2009 | Say | ...................... | A61B 5/7282 600/301 |
| 2012/0209547 A1* | 8/2012 | Katsoulis | ............... | G01R 31/52 702/58 |
| 2013/0086409 A1* | 4/2013 | Lu | .......................... | G05B 13/02 713/340 |
| 2013/0328530 A1* | 12/2013 | Beaston | .................... | H02J 7/00 320/128 |
| 2017/0194670 A1* | 7/2017 | Kawano | .................. | B60L 58/10 |
| 2017/0194807 A1* | 7/2017 | Zeine | ....................... | H02J 50/40 |
| 2017/0227571 A1* | 8/2017 | Theytaz | ................ | G01C 22/006 |
| 2018/0248399 A1* | 8/2018 | Moghaddam | ............ | H02J 50/80 |
| 2019/0128954 A1* | 5/2019 | Chen | ................... | G01R 31/2879 |

\* cited by examiner

*Primary Examiner* — Alexis B Pacheco

(57) ABSTRACT

The present invention provides a method and a device for monitoring charge and discharge currents of a battery. The method for monitoring charge and discharge currents of a battery includes the steps of: acquiring charge and discharge currents and charge and discharge states; acquiring an alarm activation threshold, a continuous calibration time for alarm activation, an alarm clearance threshold; and a continuous calibration time for alarm clearance corresponding to the charge and discharge states; activating an alarm if the charge and discharge currents are greater than or equal to the alarm activation threshold and the time of duration exceeds the continuous calibration time for alarm activation, and clearing the alarm if the charge and discharge currents are less than the alarm clearance threshold and the time of duration exceeds the continuous calibration time for alarm clearance.

8 Claims, 3 Drawing Sheets

METHOD AND DEVICE FOR MONITORING CHARGE AND DISCHARGE CURRENTS OF A BATTERY

CROSS-REFERENCE TO RELATED APPLICATION

The present invention claims a priority right of Chinese patent application number 201710224196.6 filed on Apr. 7, 2017. The content of the Chinese patent application is incorporated herein by reference in its entirety.

BACKGROUND OF THE INVENTION

Field of the Invention

The present invention generally relates to batteries and, more particularly, to a method and a device for monitoring charge and discharge currents of a battery.

Description of the Related Art

During the use of power batteries, excessive charge and discharge currents will occur inevitably. Occasional excessive current will not cause irreversible impact on the battery, while continuous high current will make consistency of the battery worse, cause battery polarization effect, and reduce life span of the battery. Therefore, during the use of power batteries, continuously excessive current should be avoided as much as possible.

In conventional battery overcurrent diagnostic methods, the current limit value of a last moment is compared with the current value of a current moment, so as to determine whether the charge and discharge states are normal. However, a conventional battery overcurrent diagnostic method has the following problems.

During the actual use of a power battery, the polarization effect of the battery will vary depending on the degree of overcurrent. Conventional battery overcurrent diagnostic methods cannot determine degrees of the overcurrent. When the current exceeds a limit value, the charge and discharge are determined as abnormal. Therefore, different methods cannot be adopted according to the effect of the charge and discharge currents on the battery.

It is desirable to provide a method and a device for monitoring charge and discharge currents of a battery, which can adopt different methods according to the effect of the charge and discharge currents on the battery.

SUMMARY OF THE INVENTION

One object of the present invention is to provide a method and a device for monitoring charge and discharge currents of a battery, which can adopt different methods according to the effect of the charge and discharge currents on the battery.

According to one embodiment of the present invention, a method for monitoring charge and discharge currents of a battery includes the steps of:

a charge and discharge parameters acquisition step of acquiring charge and discharge currents and charge and discharge states;

a monitoring parameters acquisition step of acquiring an alarm activation threshold, a continuous calibration time for alarm activation, an alarm clearance threshold, and a continuous calibration time for alarm clearance corresponding to the charge and discharge states; and an alarm monitoring step of activating an alarm if the charge and discharge currents are greater than or equal to the alarm activation threshold and a time of duration exceeds the continuous calibration time for alarm activation, and clearing the alarm if the charge and discharge currents are less than the alarm clearance threshold and the time of duration exceeds the continuous calibration time for alarm clearance.

According to one aspect of the present invention, the charge and discharge currents include a total current of a battery module including the battery, and the charge and discharge states include a charge state of the battery;

during a charging process, if a bus current is detected as the charge current, the alarm activation threshold corresponding to the charge state of the battery is a product of a charge request current and a preset first calibration percentage of charge, and the continuous calibration time for alarm activation corresponding to charge state of the battery is a preset first continuous calibration time for charge alarm activation;

during the charging process, if the bus current is detected as the discharge current, the alarm activation threshold corresponding to the charge state of the battery is the maximum of a preset second calibration value of charge and the product of a heating request current and a preset second calibration percentage of charge, the continuous calibration time for alarm activation corresponding to the charge state of the battery is the preset second continuous calibration time for charge alarm activation; and the alarm clearance threshold corresponding to the charge state of the battery is the product of charge request current and a preset third calibration percentage of charge, and the continuous calibration time for alarm clearance corresponding to the charge state of the battery is the preset continuous calibration time for charge alarm clearance.

According to one aspect of the present invention, the monitoring parameters acquisition step includes the following steps: acquiring a multi-level alarm activation threshold, a continuous calibration time for alarm activation, an alarm clearance threshold, and a continuous calibration time for alarm clearance corresponding to the charge and discharge states; and the alarm monitoring step includes the following steps: activating a corresponding level alarm if the charge and discharge currents are greater than or equal to the alarm activation threshold of one level and the time of duration exceeds the continuous calibration time for alarm activation of the corresponding level; and clearing the corresponding level alarm if the charge and discharge currents are less than the alarm clearance threshold of one level and the time of duration exceeds the continuous calibration time for alarm clearance of the corresponding level.

According to one aspect of the present invention, the charge and discharge currents include a maximum current of a battery branch, and the charge and discharge states include a recharge state of the battery;

the alarm activation threshold for one of the levels corresponding to the recharge state of the battery is the product of the recharge current limit value and the calibration percentage of recharge of the corresponding level, and all levels of continuous calibration time for alarm clearance corresponding to a recharge state is the preset continuous calibration time for recharge alarm activation; and the alarm clearance threshold corresponding to the recharge state of the battery equals to the product of the recharge current limit value and the calibration percentage of recharge of the corresponding level minus the recharge difference of the corresponding level, the recharge difference is the product of the recharge current limit value and the calibration percentage of recharge difference of the corresponding level, and all levels of continuous calibration time for alarm clearance corresponding to the charge state of the battery is the preset continuous calibration time for recharge alarm clearance.

According to one aspect of the present invention, the charge and discharge currents include a maximum current of a battery branch, and the charge and discharge states include a discharge state of the battery;

the alarm activation threshold for one of the levels corresponding to the discharge state of the battery is the product of the discharge current limit value and the calibration percentage of discharge of the corresponding level, and all levels of continuous calibration time for alarm activation corresponding to the discharge state of the battery is the preset continuous calibration time for discharge alarm activation; and the alarm clearance threshold corresponding to the discharge state of the battery equals to the product of the discharge current limit value and the calibration percentage of discharge of the corresponding level minus the discharge difference of the corresponding level, the discharge difference is the product of the discharge current limit value and the calibration percentage of discharge difference of the corresponding level, and all levels of continuous calibration time for alarm clearance corresponding to the charge state of the battery is the preset continuous calibration time for discharge alarm clearance.

According to another embodiment of the present invention, a device for monitoring charge and discharge currents of a battery includes:

a charge and discharge parameters acquisition module for acquiring charge and discharge currents and charge and discharge states;

a monitoring parameters acquisition module for acquiring an alarm activation threshold, a continuous calibration time for alarm activation, an alarm clearance threshold, and a continuous calibration time for alarm clearance corresponding to the charge and discharge states; and an alarm monitoring module for activating an alarm if the charge and discharge currents are greater than or equal to the alarm activation threshold and the time of duration exceeds the continuous calibration time for alarm activation; and clearing the alarm if the charge and discharge currents are less than the alarm clearance threshold and the time of duration exceeds the continuous calibration time for alarm clearance.

According to one aspect of the present invention; the charge and discharge currents include a total current of a battery module including the battery, and the charge and discharge states include a charge state of the battery;

during the charging process, if a bus current is detected as the charge current, the alarm activation threshold corresponding to the charge state of the battery is the product of charge request current and a preset first calibration percentage of charge, and the continuous calibration time for alarm activation corresponding to the charge state of the battery is a preset first continuous calibration time for charge alarm activation;

during the charging process, if the bus current is detected as the discharge current, the alarm activation threshold corresponding to the charge state of the battery is the maximum of a preset second calibration value of charge and the product of a heating request current and a preset second calibration percentage of charge, and the continuous calibration time for alarm activation corresponding to the charge state of the battery is a preset second continuous calibration time for charge alarm activation; and the alarm clearance threshold corresponding to the charge state of the battery is the product of charge request current and a preset third calibration percentage of charge, and the continuous calibration time for alarm clearance corresponding to the charge state of the battery is the preset continuous calibration time for charge alarm clearance.

According to one aspect of the present invention, the monitoring parameters acquisition module is configured for acquiring a multi-level alarm activation threshold, a continuous calibration time for alarm activation, an alarm clearance threshold, and a continuous calibration time for alarm clearance corresponding to the charge and discharge states; and the alarm monitoring module is configured for activating a corresponding level alarm if the charge and discharge currents are greater than or equal to the alarm activation threshold for one of the levels and the time of duration exceeds the continuous calibration time for alarm activation of the corresponding level; and clearing the corresponding level alarm if the charge and discharge currents are less than the alarm clearance threshold for one of the levels and the time of duration exceeds the continuous calibration time for alarm clearance of the corresponding level.

According to one aspect of the present invention, the charge and discharge currents include a maximum current of a battery branch, and the charge and discharge states include a recharge state of the battery;

the alarm activation threshold for one of the levels corresponding to the recharge state of the battery is the product of the recharge current limit value and the calibration percentage of recharge of the corresponding level, and all levels of continuous calibration time for alarm clearance corresponding to the recharge state of the battery is the preset continuous calibration time for recharge alarm activation; and the alarm clearance threshold corresponding to the recharge state of the battery equals to the product of the recharge current limit value and the calibration percentage of recharge of the corresponding level minus the recharge difference of the corresponding level, the recharge difference is the product of the recharge current limit value and the calibration percentage of recharge difference of the corresponding level, and all levels of continuous calibration time for alarm clearance corresponding to the charge state of the battery is the preset continuous calibration time for recharge alarm clearance.

According to one aspect of the present invention, the charge and discharge currents include a maximum current of a battery branch, and the charge and discharge states include a discharge state of the battery;

the alarm activation threshold for one of the levels corresponding to the discharge state of the battery is the product of the discharge current limit value and the calibration percentage of discharge of the corresponding level, and all levels of continuous calibration time for alarm activation corresponding to the discharge state of the battery is the preset continuous calibration time for discharge alarm activation; and the alarm clearance threshold corresponding to the discharge state of the battery equals to the product of the discharge current limit value and the calibration percentage of discharge of the corresponding level minus the discharge difference of the corresponding level, the discharge difference is the product of the discharge current limit value and the calibration percentage of discharge difference of the corresponding level, and all levels of continuous calibration time for alarm clearance corresponding to the charge state of the battery is the preset continuous calibration time for discharge alarm clearance.

Compared with the prior art, the method and the device for monitoring charge and discharge currents of a battery according to the present invention at least has the following advantages.

The alarm activation threshold, the continuous calibration time for alarm activation, the alarm clearance threshold, and the continuous calibration time for alarm clearance according to the present invention correspond to the charge and discharge states. Therefore, whether the charge and discharge currents are normal can be determined according to different charge and discharge states. At the same time, the current overrun at the current moment will be distinguished according to different levels of alarm threshold after determining whether the charge and discharge currents are normal. The higher the ratio of the current overrun, the higher the corresponding alarm level. The battery management system can activate a corresponding fault level according to the overrun level, the current at the moment will be monitored by the current overrun alarm and the actual current will be adjusted by the alarm level indirectly, which can reduce the battery inconsistency and prolong the service life of the power battery.

BRIEF DESCRIPTION OF THE DRAWINGS

Other advantages and novel features will be drawn from the following detailed description of preferred embodiments with the attached drawings. The accompanying drawings, which are incorporated in and constitute a part of this specification, illustrate embodiments of the present invention and, together with a general description of the invention given above, and the detailed description of the embodiments given below, serve to explain the principles of the invention, in which.

DETAILED DESCRIPTION OF THE PREFERRED EMBODIMENTS

Figure 1:
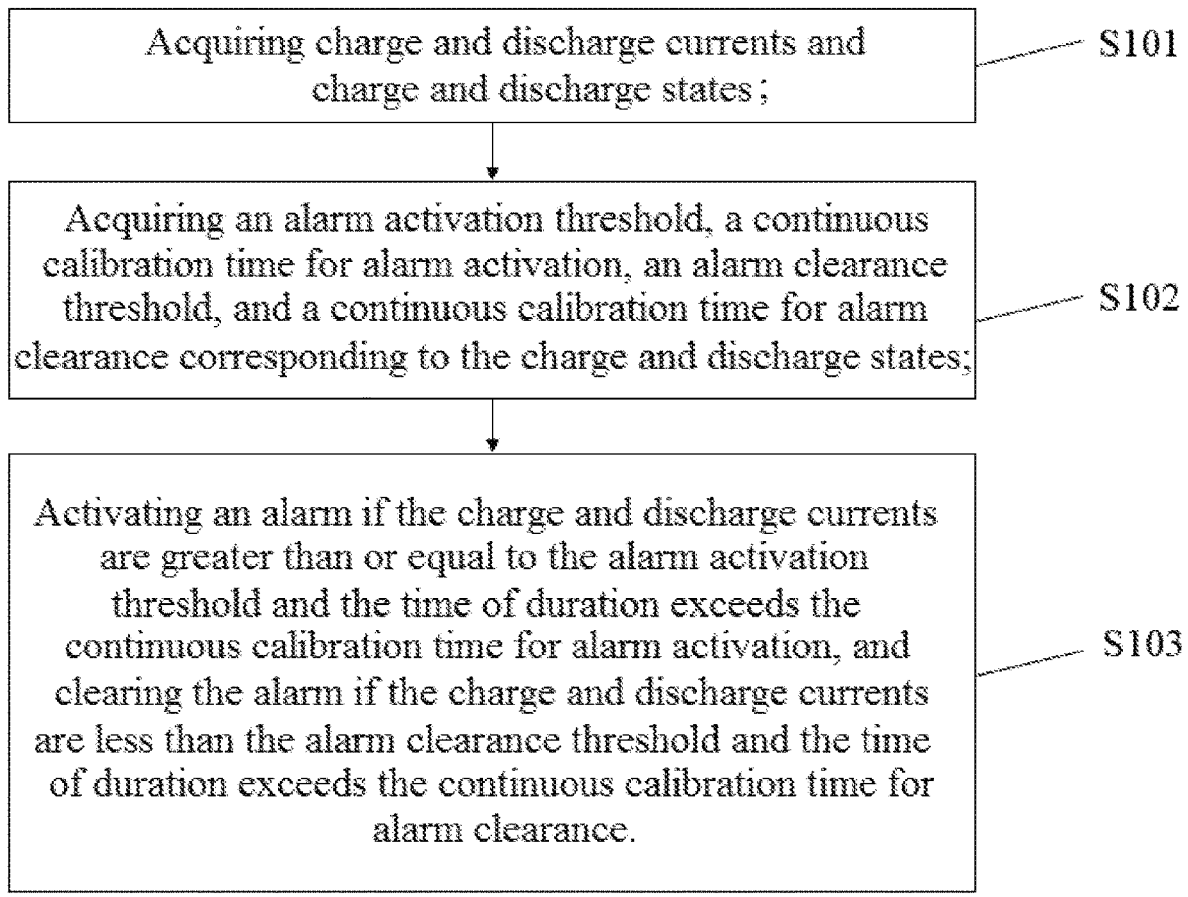
FIG. 1 depicts a work flow chart of a method for monitoring charge and discharge currents of a battery according to one embodiment of the present invention.

Example embodiments of the present invention will now be described more fully hereinafter with reference to the accompanying drawings, in which some, but not all embodiments of the invention are shown. Indeed, the invention may be embodied in many different forms and should not be construed as limited to the embodiments set forth herein; rather, these embodiments are provided so that this disclosure will satisfy applicable legal requirements. Like reference numerals refer to like elements throughout.

Referring to the work flow chart of FIG. 1, a method for monitoring charge and discharge currents of a battery according to one embodiment of the present invention includes the steps of:

Step S10, acquiring charge and discharge currents and charge and discharge states;

Step S102, acquiring an alarm activation threshold, a continuous calibration time for alarm activation, an alarm clearance threshold, and a continuous calibration time for alarm clearance corresponding to the charge and discharge states; and Step S103, activating the alarm if the charge and discharge currents are greater than or equal to the alarm activation threshold and the time of duration exceeds the continuous calibration time for alarm activation; and clearing the alarm if the charge and discharge currents are less than the alarm clearance threshold and the time of duration exceeds the continuous calibration time for alarm clearance.

Specifically, step S101 is executed at regular intervals to acquire charge and discharge currents and the charge and discharge states. In step S102, corresponding threshold value and continuation calibration time are acquired based on the charge and discharge states. Step S103 is performed to determine whether the alarm activation condition or the alarm clearance condition is satisfied. After the alarm is generated in step S103, the battery management system can activate corresponding fault repair operation according to the alarm of different charge states and adjust the actual current indirectly, which can reduce the battery inconsistency and prolong the service life of the power battery.

The alarm activation threshold, the continuous calibration time for alarm activation, the alarm clearance threshold, and the continuous calibration time for alarm clearance according to the present invention correspond to the charge and discharge states. Therefore, whether the charge and discharge currents are normal can be determined according to different charge and discharge states.

In one embodiment of the method for monitoring the charge and discharge currents of a battery according to the present invention, the charge and discharge currents include a total current of a battery module including the battery, and the charge and discharge states include a charge state of the battery;

during the charging process, if a bus current is detected as the charge current, the alarm activation threshold corresponding to the charge state of the battery is the product of charge request current and a preset first calibration percentage of charge, and the continuous calibration time for alarm activation corresponding to the charge state of the battery is a preset first continuous calibration time for charge alarm activation;

during the charging process, if the bus current is detected as the discharge current, the alarm activation threshold corresponding to the charge state of the battery is the maximum of the preset second calibration value of charge and the product of a heating request current and the preset second calibration percentage of charge, and the continuous calibration time for alarm activation corresponding to the charge state of the battery is the preset second continuous calibration time for charge alarm activation; and the alarm clearance threshold corresponding to the charge state of the battery is the product of charge request current and a preset third calibration percentage of charge, and the continuous calibration time for alarm clearance corresponding to the charge state of the battery is the preset continuous calibration time for charge alarm clearance.

Specifically, the present embodiment shows a charge current fault alarm, and the activation or clearance conditions are as following.

Clear the charge current fault alarm when the continuous calibration time of 0.5 seconds is reached in a non-charge state of the battery.

In the charge state of the battery, the charge current failure will be determined and the charge current fault alarm will be activated if any of the following conditions are established:

1) when the total current of the battery module is in the charge state, the total current of the battery module is greater than the product of the charge request current and the first calibration percentage of charge, wherein the first calibration percentage is preferably 120%, and the first continuous calibration time for charge alarm activation is preferably 15s;

2) when the total current of the battery module is in the discharge state, the total current of the battery module is greater than the maximum of the second calibration value of charge and the product of the heating request current and the second calibration percentage of charge, wherein the second calibration percentage of charge is preferably 200%, the second calibration value of charge is preferably 20A, and the second continuous calibration time for charge alarm activation is preferably 2 s.

In the charge state, the total current of the battery module is in the charge state, the charge current fault alarm will be cleared if the current is less than the product of charge request current and the third calibration percentage of charge, the continuous charge alarm clears the continuous calibration time, wherein the third calibration percentage of charge is preferably 105%, and the continuous calibration time for charge alarm clear is preferably 5 s.

According to the current charge mode, the charge request current of the corresponding mode can be AC or DC.

In one embodiment of the method for monitoring charge and discharge currents of a battery according to the present invention:

Step S102 includes the following steps: acquiring a multi-level alarm activation threshold, a continuous calibration time for alarm activation, an alarm clearance threshold, and a continuous calibration time for alarm clearance corresponding to the charge and discharge states;

Step S103 include the following steps: activating a corresponding level alarm if the charge and discharge currents are greater than or equal to the alarm activation threshold for one of the levels and the time of duration exceeds the continuous calibration time for alarm activation of the corresponding level; and clearing the corresponding level alarm if the charge and discharge currents are less than the alarm clearance threshold for one of the levels and the time of duration exceeds the continuous calibration time for alarm clearance of the corresponding level.

Figure 2:
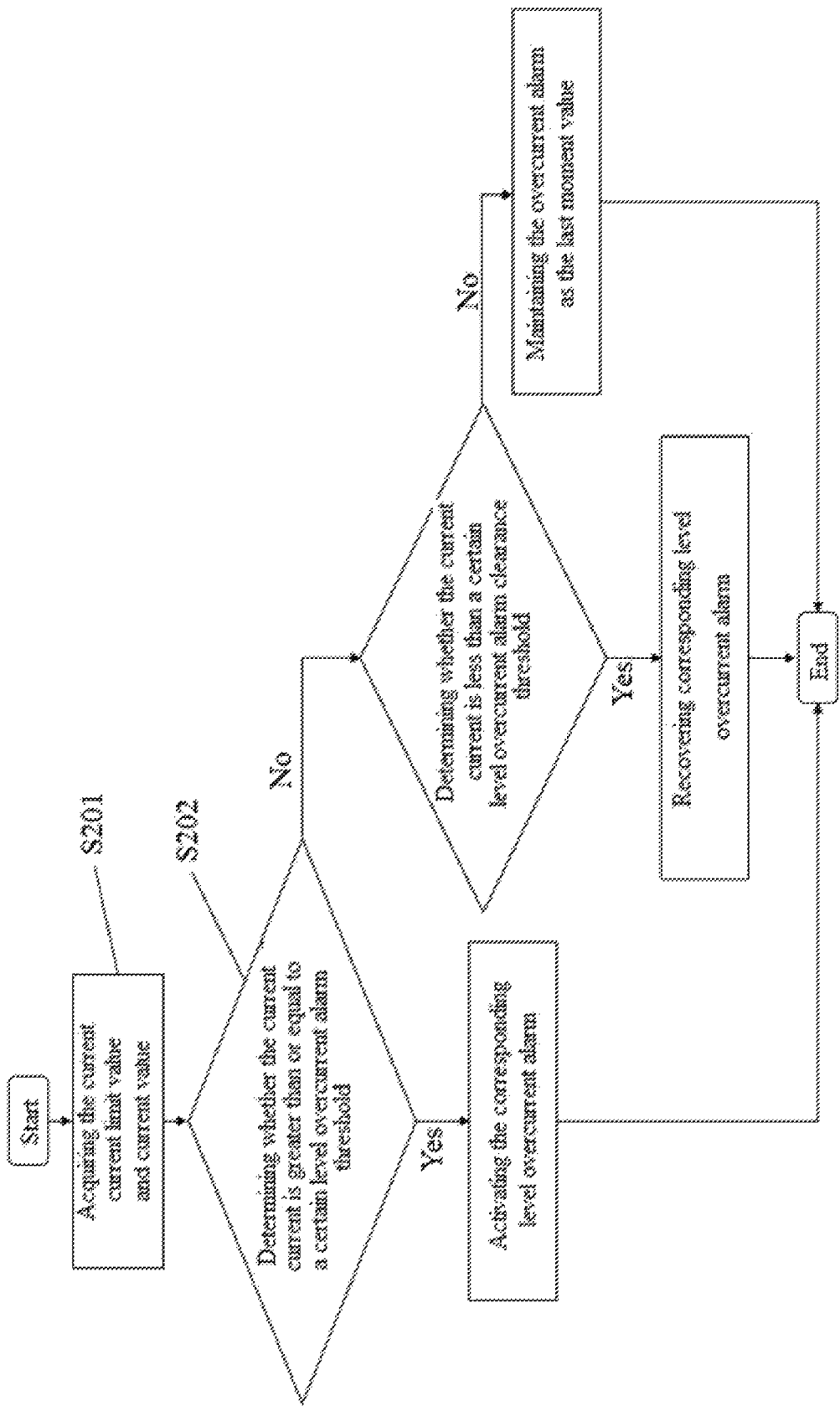
FIG. 2 depicts a work flow chart of a method for monitoring charge and discharge currents of a battery according to a preferred embodiment of the present invention.

Specifically, referring to the work flow chart of FIG. 2, a preferred embodiment of the method for monitoring charge and discharge currents of a battery according to the present invention includes the steps of:

Step S201, acquiring the current limit value and the current value, and setting three levels of alarm threshold and alarm recovery threshold based on the current limit value according to the influence of the actual current on the battery;

Step S202, activating the corresponding level alarm if the actual current is greater than a certain level alarm threshold and the time of duration exceeds the alarm determination time; and recovering the corresponding level alarm if the actual current is less than a certain level alarm recovery threshold and the time of duration exceeds the alarm determination time.

The alarm value is maintained as a last determination result when the actual current is not within the above range.

The present embodiment will determine the current limit value based on the current battery state and the electric vehicle failure level, and select three levels of alarm thresholds based on the current limit value. The battery management system compares the detected current value with the three levels of overcurrent alarm thresholds. The current will be determined as overcurrent and the corresponding level overcurrent alarm will be activated if the current value is greater than a certain level of the current limit value and the time of duration exceeds the alarm determination time. After the alarm is activated, only the current is less than the alarm clearance threshold, and the time of duration exceeds the alarm clearance time before the corresponding level overcurrent alarm can be cleared. The three levels of the current limit value represent the degree of overcurrent. The higher the current exceeds the level of the current limit value, the greater the current overcurrent and the greater the impact on battery life.

In the present embodiment, the excess degree of the present current will be distinguished according to different levels of alarm threshold after determining whether the charge and discharge currents are normal. The higher the excess degree of the current, the higher the corresponding alarm level. The battery management system can activate the corresponding fault level according to the excess level, the current at the moment will be monitored by the current overrun alarm and the actual current will be adjusted according to the alarm level indirectly, which can reduce the battery inconsistency and prolong the service life of the power battery.

In one embodiment of the method for monitoring charge and discharge currents of a battery according to the present invention, the charge and discharge currents include a maximum current of a battery branch, the charge and discharge states include a recharge state of the battery;

the alarm activation threshold for one of the levels corresponding to the recharge state of the battery is the product of the recharge current limit value and the calibration percentage of recharge of the corresponding level, and all levels of continuous calibration time for alarm clearance corresponding to a recharge state of the battery is the preset continuous calibration time for recharge alarm activation; and the alarm clearance threshold corresponding to the recharge state of the battery equals to the product of the recharge current limit value and the calibration percentage of recharge of the corresponding level minus the recharge difference of the corresponding level, the recharge difference is the product of the recharge current limit value and the calibration percentage of recharge difference of the corresponding level, and all levels of continuous calibration time for alarm clearance corresponding to the charge state of the battery is the preset continuous calibration time for recharge alarm clearance.

Specifically, the activation or clearance conditions of recharge overcurrent alarm are as following.

Clear the recharge overcurrent alarm when the continuous calibration time of 0.5 seconds is reached at a non-recharge state of the battery.

In the recharge state of the battery, the recharge overcurrent alarm of the corresponding level will be output when the branch current maximum value is greater than the product of the recharge current limit value and the calibration percentage of recharge of the corresponding level, the time of duration exceeds the continuous calibration time for recharge alarm activation of the corresponding level, wherein the calibration percentage of recharge includes three levels: 105%, 120% and 125%, and the continuous calibration time for recharge alarm activation is preferably 5 seconds.

In the recharge state of the battery, the alarm of the corresponding level will be cleared when the branch current maximum value is less than the product of the recharge current limit value and the calibration percentage of recharge of the corresponding level minus the recharge difference of the corresponding level, the time of duration exceeds the continuous calibration time for discharge alarm clearance, the calibration percentage of recharge includes three levels: 105%, 120% and 125%, and the recharge difference is the product of the recharge current limit value and the calibration percentage of recharge difference of the corresponding level, the calibration percentage of recharge difference includes three levels: 5%, 15% and 20%, and the continuous calibration time for return alarm clearance is preferably 0.2 s.

In one embodiment of the method for monitoring charge and discharge currents of a battery according to the present invention, the charge and discharge currents include a maximum current of a battery branch, and the charge and discharge states include a discharge state of the battery;

the alarm activation threshold for one of the levels corresponding to the discharge state of the battery is the product of the discharge current limit value and the calibration percentage of discharge of the corresponding level, and all levels of continuous calibration time for alarm activation corresponding to the discharge state of the battery is the preset continuous calibration time for discharge alarm activation; and the alarm clearance threshold corresponding to the discharge state of the battery equals to the product of the discharge current limit value and the calibration percentage of discharge of the corresponding level minus the discharge difference of the corresponding level, the discharge difference is the product of the discharge current limit value and the calibration percentage of discharge difference of the corresponding level, and all levels of continuous calibration time for alarm clearance corresponding to the charge state of the battery is the preset continuous calibration time for discharge alarm clearance.

Specifically, the activation or clearance conditions of discharge overcurrent alarm are as following.

Clear the discharge overcurrent alarm when the continuous calibration time of 0.5 seconds is reached at a non-discharge state of the battery.

In the discharge state of the battery, the discharge overcurrent alarm of the corresponding level will be output when the branch current maximum value is greater than the product of the discharge current limit value and the calibration percentage of discharge of the corresponding level, the time of duration exceeds the continuous calibration time for discharge alarm activation of the corresponding level. The calibration percentage of discharge includes three levels: 105%, 120% and 125%, and the continuous calibration time for discharge alarm activation is preferably 5 seconds.

In the discharge state of the battery, the alarm of the corresponding level will be cleared when the branch current maximum value is less than the product of the discharge current limit value and the calibration percentage of discharge of the corresponding level minus the discharge difference of the corresponding level, and the time of duration exceeds the continuous calibration time for discharge alarm clearance. The calibration percentage of discharge includes three levels: 105%, 120% and 125%, and the discharge difference is the product of the discharge current limit value and the calibration percentage of discharge difference of the corresponding level. The calibration percentage of discharge difference includes three levels: 5%, 15% and 20%, and the continuous calibration time for discharge alarm clearance is preferably 0.2 s.

Figure 3:
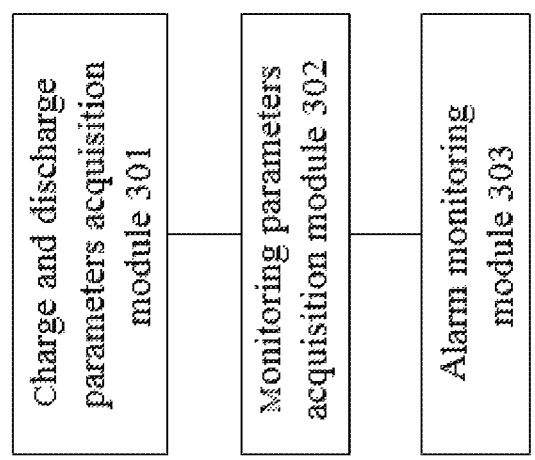
FIG. 3 depicts a block diagram of a device for monitoring charge and discharge currents of a battery according to one embodiment of the present invention.

Referring to the block diagram of FIG. 3, a device for monitoring charge and discharge currents of a battery according to one embodiment of the present invention includes:

a charge and discharge parameters acquisition module 301 for acquiring charge and discharge currents and charge and discharge states;

a monitoring parameters acquisition module 302 for acquiring an alarm activation threshold, a continuous calibration time for alarm activation, an alarm clearance threshold, and a continuous calibration time for alarm clearance corresponding to the charge and discharge states; and an alarm monitoring module 303 for activating an alarm if the charge and discharge currents are greater than or equal to the alarm activation threshold and the time of duration exceeds the continuous calibration time for alarm activation, and clearing the alarm if the charge and discharge currents are less than the alarm clearance threshold and the time of duration exceeds the continuous calibration time for alarm clearance.

According to one embodiment of the device for monitoring charge and discharge currents of a battery of the present invention, the charge and discharge currents include a total current of a battery module including the battery, and the charge and discharge states include a charge state of the battery;

during the charging process, if a bus current is detected as the charge current, the alarm activation threshold corresponding to the charge state of the battery is the product of charge request current and a preset first calibration percentage of charge, the continuous calibration time for alarm activation corresponding to the charge state of the battery is a preset first continuous calibration time for charge alarm activation;

during the charging process, if the bus current is detected as the discharge current, the alarm activation threshold corresponding to the charge state of the battery is the maximum of a preset second calibration value of charge and the product of a heating request current and a preset second calibration percentage of charge, and the continuous calibration time for alarm activation corresponding to the charge state of the battery is the preset second continuous calibration time for charge alarm activation; and the alarm clearance threshold corresponding to the charge state of the battery is the product of charge request current and a preset third calibration percentage of charge, and the continuous calibration time for alarm clearance corresponding to the charge state of the battery is the preset continuous calibration time for charge alarm clearance.

In one embodiment of the device for monitoring charge and discharge currents of a battery according to the present invention:

the monitoring parameters acquisition module is configured for acquiring a multi-level alarm activation threshold, a continuous calibration time for alarm activation, an alarm clearance threshold, and a continuous calibration time for alarm clearance corresponding to the charge and discharge states;

the alarm monitoring module is configured for activating a corresponding level alarm if the charge and discharge currents are greater than or equal to the alarm activation threshold for one of the levels and the time of duration exceeds the continuous calibration time for alarm activation of the corresponding level, and clearing the corresponding level alarm if the charge and discharge currents are less than the alarm clearance threshold for one of the levels and the time of duration exceeds the continuous calibration time for alarm clearance of the corresponding level.

In one embodiment of the device for monitoring charge and discharge currents of a battery according to the present invention, the charge and discharge currents include a maximum current of a battery branch, and the charge and discharge states include a recharge state of the battery;

the alarm activation threshold for one of the levels corresponding to the recharge state of the battery is the product of the recharge current limit value and the calibration percentage of recharge of the corresponding level, and all levels of continuous calibration time for alarm clearance corresponding to the recharge state of the battery is the preset continuous calibration time for recharge alarm activation;

the alarm clearance threshold corresponding to the recharge state of the battery equals to the product of the recharge current limit value and the calibration percentage of recharge of the corresponding level minus the recharge difference of the corresponding level, the recharge difference is the product of the recharge current limit value and the calibration percentage of recharge difference of the corresponding level, and all levels of continuous calibration time for alarm clearance corresponding to a charge state of the battery is the preset continuous calibration time for recharge alarm clearance.

In one embodiment of the device for monitoring charge and discharge currents of a battery according to the present invention, the charge and discharge currents include a maximum current of a battery branch, and the charge and discharge states include a discharge state of the battery;

the alarm activation threshold for one of the levels corresponding to the discharge state of the battery is the product of the discharge current limit value and the calibration percentage of discharge of the corresponding level, and all levels of continuous calibration time for alarm activation corresponding to a discharge state of the battery is the preset continuous calibration time for discharge alarm activation; and the alarm clearance threshold corresponding to the discharge state of the battery equals to the product of the discharge current limit value and the calibration percentage of discharge of the corresponding level minus the discharge difference of the corresponding level, the discharge difference is the product of the discharge current limit value and the calibration percentage of discharge difference of the corresponding level, and all levels of continuous calibration time for alarm clearance corresponding to the charge state of the battery is the preset continuous calibration time for discharge alarm clearance.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions describe example embodiments, it should be appreciated that alternative embodiments without departing from the scope of the appended claims. Although specific terms are employed herein, they are used in a generic and descriptive sense only and not for purposes of limitation.

What is claimed is:

1. A method for monitoring charge and discharge currents of a battery, comprising the steps of:
   acquiring charge and discharge currents and charge and discharge states, the charge and discharge currents comprise a maximum current of a battery branch, and the charge and discharge stats comprise a discharge state of the battery;
   acquiring multi-level alarm activation threshold and a continuous calibration time for alarm activation corresponding to the discharge states; and
   activating corresponding level alarm if the charge and discharge currents are greater than the alarm activation threshold for one of the levels and the time of duration exceeds the continuous calibration time for alarm activation of the corresponding level,
   wherein the alarm activation threshold for one of the levels corresponding to the discharge state of the battery is the product of the discharge current limit value and the calibration percentage of discharge of the corresponding level, and all levels of continuous calibration time for alarm activation corresponding to the discharge state of the battery is a preset continuous calibration time for discharge alarm activation.

2. The method for monitoring charge and discharge currents of a battery of claim 1, wherein the charge and discharge currents comprise a total current of a battery module comprising the battery, and the charge and discharge states comprise a charge state of the battery;
   during a charging process, if a bus current is detected as the charge current, the alarm activation threshold corresponding to the charge state of the battery is a product of charge request current and a preset first calibration percentage of charge, the continuous calibration time for alarm activation corresponding to the charge state of the battery is a preset first continuous calibration time for charge alarm activation;
   during the charging process, if the bus current is detected as the discharge current, the alarm activation threshold corresponding to the charge state of the battery is the maximum of a preset second calibration value of charge and a product of a heating request current and a preset second calibration percentage of charge, the continuous calibration time for alarm activation corresponding to the charge state of the battery is a preset second continuous calibration time for charge alarm activation; and
   the alarm clearance threshold corresponding to the charge state of the battery is a product of the charge request current and a preset third calibration percentage of charge, and the continuous calibration time for alarm clearance corresponding to the charge state of the battery is the preset continuous calibration time for charge alarm clearance.

3. The method for monitoring charge and discharge currents of a battery of claim 1, wherein the charge and discharge currents comprise a maximum current of a battery branch, and the charge and discharge states comprise a recharge state of the battery;
   the alarm activation threshold for one of the levels corresponding to the recharge state of the battery is a product of the recharge current limit value and the calibration percentage of recharge of the corresponding level, and all levels of continuous calibration time for alarm clearance corresponding to the recharge state of the battery is the preset continuous calibration time for recharge alarm activation; and the alarm clearance threshold corresponding to the recharge state of the battery equals to the product of the recharge current limit value and the calibration percentage of recharge of the corresponding level minus a recharge difference of the corresponding level, and the recharge difference is the product of the recharge current limit value and the calibration percentage of recharge difference of the corresponding level, and all levels of continuous calibration time for alarm clearance corresponding to the charge state of the battery is the preset continuous calibration time for recharge alarm clearance.

4. A device for monitoring charge and discharge currents of a battery, comprising:

a charge and discharge parameters acquisition module for acquiring charge and discharge currents and charge and discharge states, the charge and discharge currents comprise a maximum current of a battery branch, and the charge and discharge stats comprise a discharge state of the battery;

a monitoring parameters acquisition module for acquiring corresponding level alarm activation threshold and a continuous calibration time for alarm activation corresponding to the discharge states; and an alarm monitoring module for activating corresponding level alarm if the charge and discharge currents are greater than the alarm activation threshold for one of the levels and the time of duration exceeds the continuous calibration time for alarm activation of the corresponding level, wherein the alarm activation threshold for one of the levels corresponding to the discharge state of the battery is the product of the discharge current limit value and the calibration percentage of discharge of the corresponding level, and all levels of continuous calibration time for alarm activation corresponding to the discharge state of the battery is a preset continuous calibration time for discharge alarm activation.

5. The device for monitoring charge and discharge currents of a battery of claim 4, wherein the charge and discharge currents comprise a total current of a battery module comprising the battery, and the charge and discharge states comprise a charge state of the battery;

during a charging process, if a bus current is detected as the charge current, the alarm activation threshold corresponding to the charge state of the battery is a product of charge request current and a preset first calibration percentage of charge, the continuous calibration time for alarm activation corresponding to the charge state of the battery is a preset first continuous calibration time for charge alarm activation;

during the charging process, if the bus current is detected as the discharge current, the alarm activation threshold corresponding to the charge state of the battery is the maximum of a preset second calibration value of charge and a product of a heating request current and a preset second calibration percentage of charge, the continuous calibration time for alarm activation corresponding to the charge state of the battery is the preset second continuous calibration time for charge alarm activation; and the alarm clearance threshold corresponding to the charge state of the battery is a product of charge request current and a preset third calibration percentage of charge, and the continuous calibration time for alarm clearance corresponding to the charge state of the battery is the preset continuous calibration time for charge alarm clearance.

6. The device for monitoring charge and discharge currents of a battery of claim 4, wherein the charge and discharge currents comprise a maximum current of a battery branch, and the charge and discharge states comprise a recharge state of the battery;

the alarm activation threshold for one of the levels corresponding to the recharge state of the battery is a product of the recharge current limit value and the calibration percentage of recharge of the corresponding level, and all levels of continuous calibration time for alarm clearance corresponding to the recharge state of the battery is the preset continuous calibration time for recharge alarm activation; and the alarm clearance threshold corresponding to the recharge state of the battery equals to the product of the recharge current limit value and the calibration percentage of recharge of the corresponding level minus the recharge difference of the corresponding level, and the recharge difference is the product of the recharge current limit value and the calibration percentage of recharge difference of the corresponding level, and all levels of continuous calibration time for alarm clearance corresponding to the charge state of the battery is the preset continuous calibration time for recharge alarm clearance.

7. The method for monitoring charge and discharge currents of a battery of claim 1, further comprising the steps of:

acquiring a multi-level alarm clearance threshold and a continuous calibration time for alarm clearance corresponding to the discharge state; and clearing the corresponding level alarm if the charge and discharge currents are less than the alarm clearance threshold for one of the levels and the time of duration exceeds the continuous calibration time for alarm clearance of the corresponding level;

wherein the alarm clearance threshold corresponding to the discharge state of the battery equals to the product of the discharge current limit value and the calibration percentage of discharge of the corresponding level minus a discharge difference of the corresponding level, and the discharge difference is the product of the discharge current limit value and the calibration percentage of discharge difference of the corresponding level, and all levels of continuous calibration time for alarm clearance corresponding to the charge state of the battery is the preset continuous calibration time for discharge alarm clearance.

8. The device for monitoring charge and discharge currents of a battery of claim 4, wherein the monitoring parameters acquisition module is further configured for acquiring a multi-level alarm clearance threshold and a continuous calibration time for alarm clearance corresponding to the discharge states; and the alarm monitoring module is further configured for clearing the corresponding level alarm if the charge and discharge currents are less than the alarm clearance threshold for one of the levels and the time of duration exceeds the continuous calibration time for alarm clearance of the corresponding level;

wherein the alarm clearance threshold corresponding to the discharge state of the battery equals to the product of the discharge current limit value and the calibration percentage of discharge of the corresponding level minus a discharge difference of the corresponding level, and the discharge difference is the product of the discharge current limit value and the calibration percentage of discharge difference of the corresponding level, and all levels of continuous calibration time for alarm clearance corresponding to the charge state of the battery is the preset continuous calibration time for discharge alarm clearance.

\* \* \* \* \*